(12) United States Patent
Hermann

(10) Patent No.: US 9,705,480 B2
(45) Date of Patent: Jul. 11, 2017

(54) CIRCUIT AND METHOD FOR GENERATING AN OUTPUT SIGNAL HAVING A VARIABLE PULSE DUTY FACTOR

(71) Applicant: Robert Bosch GmbH, Stuttgart (DE)

(72) Inventor: Carsten Hermann, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/912,713

(22) PCT Filed: Jul. 9, 2014

(86) PCT No.: PCT/EP2014/064677
§ 371 (c)(1),
(2) Date: Feb. 18, 2016

(87) PCT Pub. No.: WO2015/028186
PCT Pub. Date: Mar. 5, 2015

(65) Prior Publication Data
US 2016/0204769 A1 Jul. 14, 2016

(30) Foreign Application Priority Data
Aug. 30, 2013 (DE) ........................ 10 2013 217 365

(51) Int. Cl.
*H03K 5/04* (2006.01)
*H03K 3/017* (2006.01)
*H03K 5/156* (2006.01)

(52) U.S. Cl.
CPC ........... *H03K 3/017* (2013.01); *H03K 5/1565* (2013.01)

(58) Field of Classification Search
CPC .................................................... H03K 5/1565
See application file for complete search history.

(56) References Cited

U.S. PATENT DOCUMENTS

| | | | |
|---|---|---|---|
| 3,883,756 A | | 5/1975 | Dragon |
| 5,451,893 A | * | 9/1995 | Anderson ................ H03K 9/08 327/174 |
| 6,154,076 A | | 11/2000 | Hastings |

FOREIGN PATENT DOCUMENTS

EP        0 135 121        3/1985

OTHER PUBLICATIONS

International Search Report for PCT/EP2014/064677, dated Oct. 17, 2014.

* cited by examiner

*Primary Examiner* — Daniel Puentes
(74) *Attorney, Agent, or Firm* — Norton Rose Fulbright US LLP; Gerard Messina

(57) ABSTRACT

A circuit for generating an output signal having a second pulse duty factor from an input signal having a first pulse duty factor includes a first capacitor and a second capacitor which are each connected to a charge source for periodically charging the capacitors. A voltage across the charged first capacitor is defined as a reference voltage, and the pulse duty factor of the output signal is defined by the charging period of the second capacitor required for reaching the reference voltage.

9 Claims, 7 Drawing Sheets

CIRCUIT AND METHOD FOR GENERATING AN OUTPUT SIGNAL HAVING A VARIABLE PULSE DUTY FACTOR

BACKGROUND OF THE INVENTION

1. Field of the Invention

The present invention relates to a circuit and a method for generating an output signal having a variable pulse duty factor. Moreover, the present invention relates to a digital switching controller, and a motor vehicle which includes this type of circuit and this type of digital switching controller.

2. Description of the Related Art

Signals, for example clock signals or pulse width-modulated (PWM) signals, have a pulse duty factor, also referred to as the duty factor. The pulse duty factor defines the ratio of the pulse duration, i.e., the active signal component, to the period of the signal.

Clock signals having a pulse duty factor of 50%, or clock signals which may be generated, for example, from a basic clock pulse by bistable trigger elements or flip-flops, are easily implemented in digital technology. Thus, for example, a clock signal having one-half the frequency and a pulse duty factor of 25% or 75% may be derived from a basic clock pulse. The closer the pulse duty factor is to the 0% or 100% limit, the higher the basic clock pulse must be. In addition, only discrete values are settable for the pulse duty factor.

However, a clock pulse is often needed whose pulse duty factor may assume an arbitrary value. This is complicated by the fact that a correspondingly high basic clock pulse is quite often not available.

An important application for these types of clock pulses or clock signals is a digital switching controller, in which the main difficulty at the present time lies in converting the pulse duty factor computed from the digital component into an analog signal for controlling an output stage of the switching controller. For this purpose, it is common to either use a basic clock pulse which is much faster for the digital component, or to shift functions which may be solved digitally into the analog component.

A faster basic clock pulse imposes high requirements on the digital component. If, for example, a switching controller frequency of 1 MHz with a pulse duty factor which is precisely settable to approximately 1% is to be implemented, this would require a digital clock pulse of 1 MHz× $2^7$=128 MHz, which at the present time is hardly achievable in the automotive field, for example.

A shift into the analog component results in a high level of complexity for the signal conversion, for example in the form of a fast D/A converter, a comparator, and a saw-tooth voltage generator having a precise amplitude.

BRIEF SUMMARY OF THE INVENTION

According to the present invention, a circuit for generating an output signal, having a second pulse duty factor, from an input signal having a first pulse duty factor is provided, which includes a first capacitor and a second capacitor which are each connected to at least one charge source for periodically charging the capacitors, a voltage across the charged first capacitor being defined as a reference voltage, and the pulse duty factor of the output signal being defined by the charging period of the second capacitor until the reference voltage is reached.

The circuit according to the present invention has the advantage that an arbitrary, precise pulse duty factor is generated using a simple circuit. This is even possible with a small basic clock pulse, i.e., with an input signal or input clock signal whose frequency or clock pulse is in the range of the clock pulse or is identical to the clock pulse of the output signal or output clock signal. The cooperation between the first capacitor, which in the charged state specifies a reference voltage, and the second capacitor, whose charging period until reaching the reference voltage, which drops across this capacitor, specifies the pulse duty factor, is easily implemented circuitry-wise.

The term "charge source" here includes a source such as a current source, a constant current source, or a voltage source, optionally with additional wiring, which is suitable for charging a capacitor in a finite time.

It is possible for the input signal and the output signal to have an identical frequency or clock pulse. The generation of the output signal from a basic clock pulse having the same frequency is possible by using or wiring two capacitors, and allows broad use of the circuit. At the same pulse or frequency, the input signal and output signal may be time-delayed.

It is also possible for the pulse duration of the output signal to be equal to the charging time of the second capacitor. This allows the pulse duty factor to be directly set via the charging time, i.e., via the capacitor, primarily the capacitance, and via the charge source, i.e., via the charging current. Likewise, the pulse duration may be equal to the charging time of the second capacitor plus one-half the period of the input signal.

A comparator for comparing the reference voltage and the voltage of the second capacitor may advantageously be provided, and a bistable trigger element may be provided whose inputs are in communication with an output of the comparator and with the input signal, and with whose output the output signal is provided. This simple configuration allows rapid and precise generation of the output signal. It may be provided that the comparator outputs a signal when the two voltages across the capacitors have the same value; a comparison to an offset is likewise possible. The output signal may be present directly at the bistable trigger element or flip-flop, or may be provided via further wiring.

A switch actuator may be provided for charging and/or discharging the first capacitor, and the input signal may be connected to a clock pulse input of the bistable trigger element in such a way that the pulse duty factor of the output signal is between 0% and 100%. In the present context, clocking is understood to mean the charging and/or discharging operations. With the aid of the switch actuator, the first capacitor may be charged and discharged independently of the clock pulse or pulse duty factor of the input signal, which allows a broad setting of the pulse duty factor of the output signal between 0% and 100%, or between 0% and 50% and between 50% and 100%.

The pulse component of the input signal may be present at a signal input of the bistable trigger element, and the output signal of the comparator may be present at a reset input of the bistable trigger element, in such a way that the pulse duty factor of the output signal is between 50% and 100%. A pulse duty factor between 50% and 100% may be set with simple wiring of the bistable trigger element. The pulse duty factor of the input signal is prolonged by the charging period of the second capacitor.

The input signal and the output of the bistable trigger element may be connected to inputs of an AND gate, and the output signal may be provided at an output of the AND gate in such a way that the pulse duty factor of the output signal is between 0% and 50%. A pulse duty factor between 0% and 50% may be set with simple wiring of the bistable trigger element. By resetting the bistable trigger element, the output of the AND gate is set to zero, and the pulse component of the output signal is thus shortened in comparison to the pulse component of the input signal.

The method according to the present invention for generating an output signal, having a second pulse duty factor, from an input signal having a first pulse duty factor basically includes the following steps: a first capacitor is periodically charged up to a reference voltage by a charge source, a second capacitor is periodically charged by a second charge source, and the pulse duty factor of the output signal is formed from the charging period of the second capacitor which is required until the reference voltage is reached. The periodic charging provides the clock pulse of the output signal, whereby the clock pulse may be a precise function of the charging period of the first capacitor, i.e., a function of the time during which the capacitor, which is discharged or partially discharged in a defined manner, is fully charged. The charging period may directly correspond to the clock pulse, or may be a fraction or a multiple of the clock pulse.

The pulse duration of the output signal may be equal to the charging time of the second capacitor. This allows the pulse duty factor to be directly set via the charging time, i.e., via the capacitor, primarily the capacitance, and via the charge source, i.e., via the charging current. It is also possible for the pulse duration to correspond to the charging time of the first and the second capacitors.

It is advantageously provided that two (intermediate) output signals are generated in parallel, and that the two output signals and the input signal are XOR-linked for generating the (ultimate) output signal. This method and this circuit allow a doubling of the frequency with the aid of a simple combinatory logic circuit. The two (intermediate) output signals preferably have pulse duty factors [which are], for example, 25% and 75% complementary to the pulse duty factor of 50%.

According to one aspect of the present invention, a digital switching controller is provided which includes a digital component for generating a control signal, a pulse duty factor, an output stage which is controlled with the control signal, and a circuit as described above for generating the control signal. The advantages and modifications described above apply. The digital component computes the pulse duty factor with which the output stage clocks. The digital pulse duty factor information is converted by the circuit according to the present invention into a control signal in the form of an analog PWM signal which controls the output stage. Further components of the digital switching controller, such as the detection of the control voltage and possibly the input voltage, are not considered here. According to the present invention, only a small clock pulse for the digital component is necessary for the conversion into the control signal.

According to another aspect of the present invention, a motor vehicle which includes a digital switching controller as described above is provided, the switching controller being connected to a vehicle electrical system of the motor vehicle. The switching controller according to the present invention is particularly suited for the special requirements in the automotive field. The advantages and modifications described above apply.

According to yet another aspect of the present invention, a motor vehicle which includes a circuit as described above is provided, the circuit being connected to a vehicle electrical system of the motor vehicle. The circuit according to the present invention is particularly suited for the special requirements in the automotive field. The advantages and modifications described above apply.

The present invention is particularly advantageous in the automotive field, since the semiconductor technologies here are approximately ten years behind those in consumer electronics, for example. Accordingly, clock pulses in the range of 100 MHz are already a major challenge here.

Exemplary embodiments of the present invention are explained in greater detail with reference to the drawings and the following description.

DETAILED DESCRIPTION OF THE INVENTION

Circuits are described below which generate a clock pulse having the same frequency and an arbitrary, precise pulse duty factor between 0% and 100% from a predefined basic clock pulse having a pulse duty factor of 50%. The arbitrary pulse duty factor may be either fixedly or variably set. The variable pulse duty factor may be individually set via a data word, for example.

The circuits have the basic principle that two capacitors are cyclically charged in each case by a charge source, for example in the form of a current source. Different charging times result from the ratio of the capacitors, i.e., in particular the capacitances thereof, and the ratio of the currents in order to charge both capacitors to a defined voltage, which may be identical.

The different charging times may then be used for generating a clock signal having an arbitrary, precise pulse duty factor by using one of the two times as a reference, while the other time is used directly as a setting parameter for the pulse duty factor. The reference of the one capacitor may be the charging time or the voltage of the capacitor, for example, which is then used as a reference value or comparative value for the second capacitor.

Figure 1:
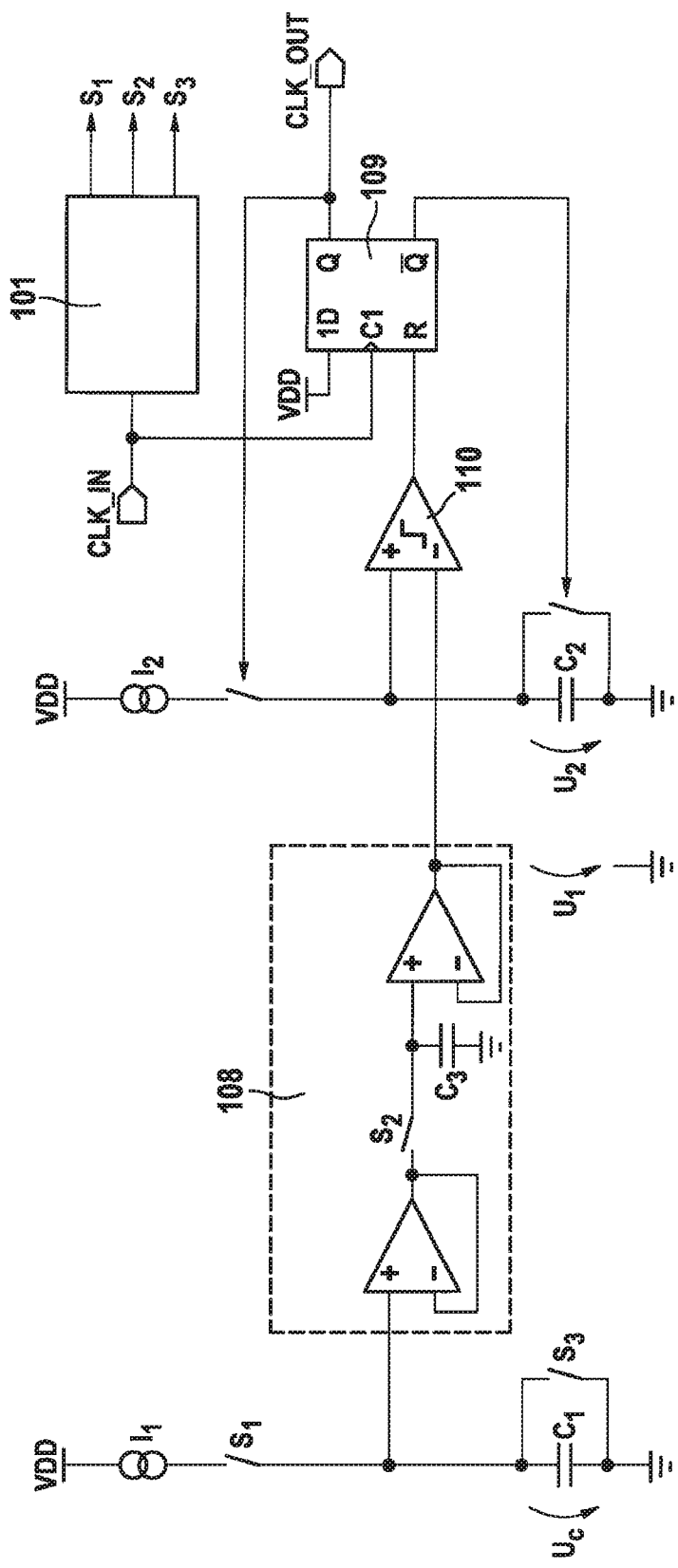
FIG. 1 shows a circuit diagram of a circuit for a fixed pulse duty factor between 0% and 100%.

FIG. 1 illustrates a circuit 100 for generating an arbitrary pulse duty factor between 0% and 100%. The pulse duty factor may be 0%; i.e., no pulse component is then contained in the output signal.

Likewise, pulse duty factor TV may be 100%; i.e., the output signal is composed only of a pulse component. The expression "between 0% and 100%" may also be defined as "0%<TV<100%." The above explanation that the limits of the pulse duty factor may be included or excluded also applies to further ranges mentioned herein.

An input clock pulse CLK_IN having a first pulse duty factor is supplied to circuit 100, which generates therefrom an output signal CLK_OUT having a second pulse duty factor. The first pulse duty factor is generally different from the second pulse duty factor.

Circuit 100 includes a first capacitor $C_1$ which is connected to a first charge source $I_1$ via a switch $S_1$. The charge source, in the form of a current source here, periodically provides a current $I_1$ to capacitor $C_1$. The periodicity of the charging of first capacitor $C_1$ is achieved via opening and closing of switch $S_1$. For this purpose, a switch actuator 101 generates three nonoverlapping clock signals $S_1$, $S_2$, and $S_3$ from basic clock pulse CLK_IN. Switch actuator 101 is illustrated in detail in FIG. 2.

Figure 2:
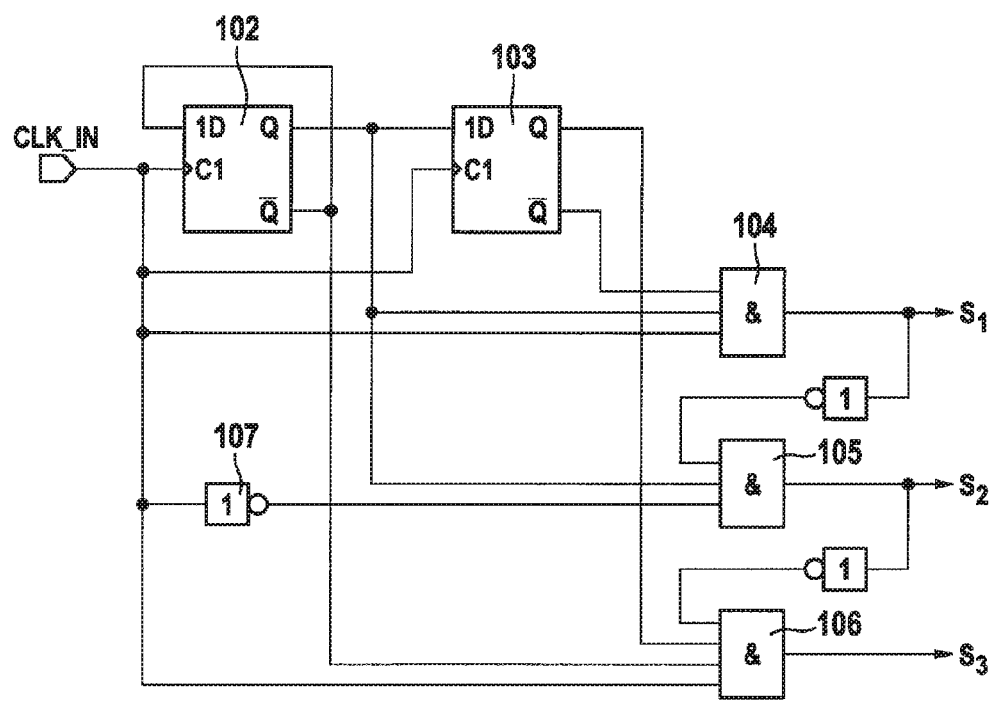
FIG. 2 shows a circuit diagram of the control circuit from FIG. 1.

FIG. 2 shows the circuit diagram of switch actuator 101. The input signal, i.e., basic clock pulse CLK_IN, is present at clock pulse inputs of two D flip-flops 102 and 103, so that D flip-flops 102 and 103 may be set with each rising flank of CLK_IN. In addition, input signal CLK_IN is present at three AND gates 104, 105, and 106, basic clock pulse CLK_IN being present at AND gate 105 and being inverted via an inverter 107.

D flip-flop 102 is set with the first rising clock pulse flank of CLK_IN, so that Q=1. D flip-flop 103 is not yet set, so that its inverted output is equal to 1. Similarly, AND gate 104 switches and puts through the first pulse of input signal CLK_IN (see FIG. 3). AND gate 104 blocks with the falling flank of CLK_IN, so that switch signal $S_1$ corresponds to the first pulse of basic clock pulse CLK_IN.

AND gate 105, at whose output switch signal $S_2$ is present, switches during the zero level of basic clock pulse CLK_IN due to inverter 107. Since inverted switch signal $S_1$ is present in inverter 105, switch signal $S_2$ increases with a slight time delay in comparison to $S_1$, so that the two signals are free of overlap.

Figure 3:
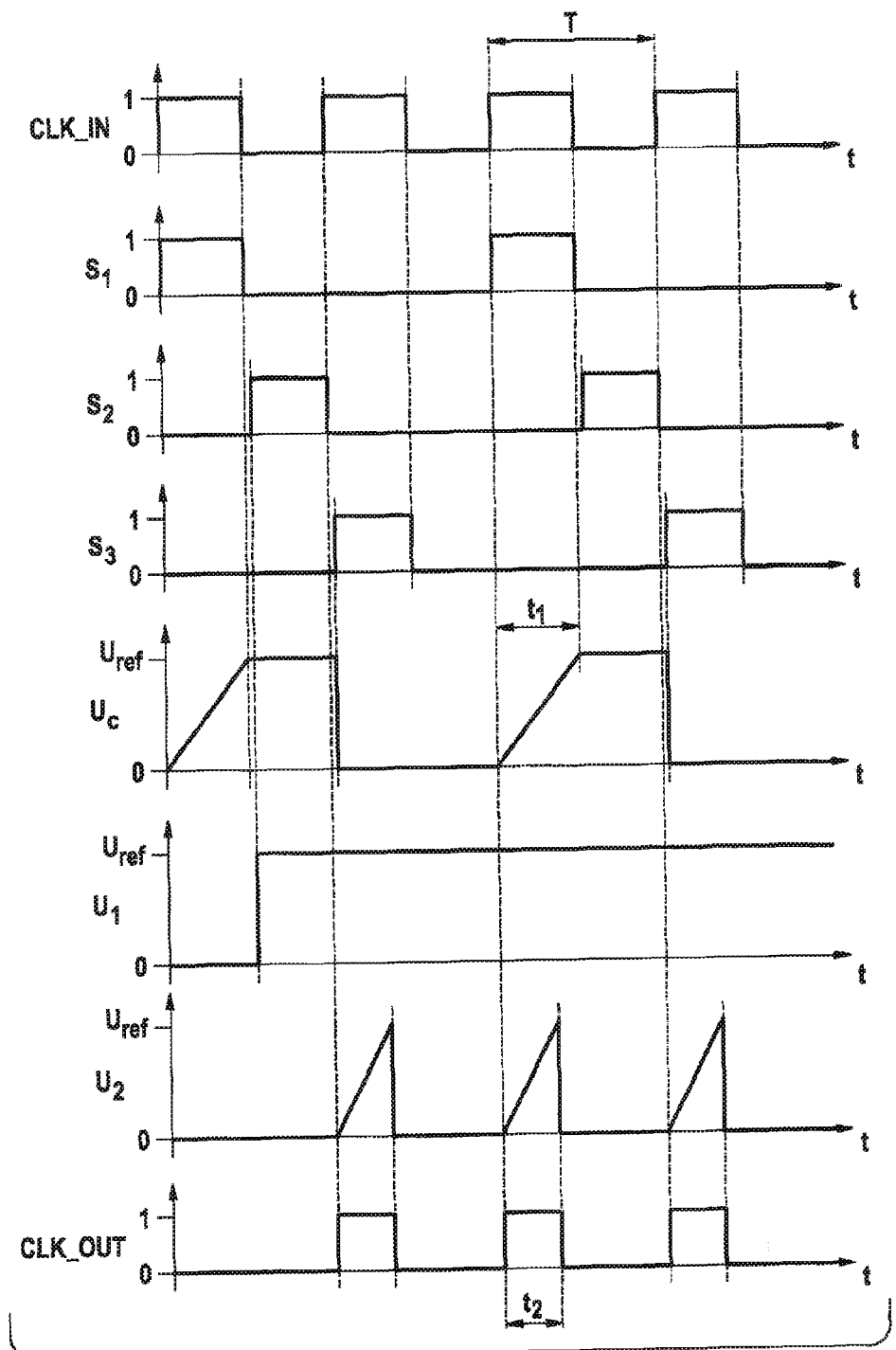
FIG. 3 shows a diagram with signal patterns of the circuit from FIG. 1.

The states of the two D flip-flops 102 and 103 are further shifted with the next positive flank of CLK_IN. This means that a "1" is present at the inverted output of flip-flop 102 and at the noninverted output of flip-flop 103, so that AND gate 106 now outputs the pulse of basic clock pulse CLK_IN as signal $S_3$. The same as for signal $S_2$, the nonoverlap is ensured for signal $S_3$ by the inverted consideration of signal $S_2$. Since the noninverting output of D flip-flop 102 is zero, AND gate 105 does not switch during the second falling flank of CLK_IN. The method described and illustrated in FIG. 3 is repeated for the next rising flank of input signal CLK_IN.

The mode of operation of circuit 100 from FIG. 1 is now described below. FIG. 3 illustrates the signal patterns of circuit 100 from FIG. 1. While $S_1$=1, i.e., when switch $S_1$ is closed, capacitor $C_1$ is charged to voltage $U_{ref}$ by current source $I_1$. Or, expressed another way, capacitor $C_1$ is charged by current source $I_1$ until voltage $U_c$ across the capacitor has reached value $U_{ref}$. Voltage $U_{ref}$ is computed as follows:

$$U_{ref}=I_1(t_1 \times C_1), \quad (1)$$

where charging time $t_1$ corresponds to one-half period T of basic clock pulse CLK_IN:

$$t_1=C_1=T/2. \quad (2)$$

Voltage $U_{ref}$ is transferred by a sample-and-hold circuit 108, while $S_2$=1 is transferred to capacitor $C_3$ and stored there. Voltage $U_{ref}$ is available as voltage $U_1$, with $S_2$=1, at the output of sample-and-hold circuit 108.

Capacitor $C_1$ is discharged again while $S_3$=1. The charging and discharging of $C_1$ periodically continues via the pattern of signals $S_1$, $S_2$, and $S_3$. Voltage $U_1$ at the output of sample-and-hold circuit 108 changes after the first period of CLK_IN only when period T of basic clock pulse CLK_IN or current $I_1$ changes.

D flip-flop 109 is set with each rising flank of input signal CLK_IN, resulting in output signal CLK_OUT=1 being set and capacitor $C_2$ being charged by current source $I_2$ until voltage $U_2$ across capacitor $C_2$ has reached value $U_{ref}$. When $U_2=U_{ref}$, a comparator 110, which compares the two voltages $U_1$ and $U_2$ to one another, resets D flip-flop 109. Due to D flip-flop 109 being reset, CLK_OUT goes to zero, so that the pulse of output signal CLK_OUT is terminated. With the resetting of D flip-flop 109, capacitor $C_2$ is discharged via the inverting output, with the aid of a switch.

The clock pulse of output signal CLK_OUT is determined via charging time $t_1$ of first capacitor $C_1$. The pulse duration and thus the pulse duty factor of output signal CLK_OUT is determined by charging period $t_2$ of the second capacitor. Voltage $U_c$ of first charged capacitor $C_1$ at the level of $U_{ref}$ is used as a reference voltage for second capacitor $C_2$. More precisely, the pulse of output signal CLK_OUT is terminated when voltage $U_2$ across second capacitor $C_2$ reaches value $U_{ref}$. The frequency or the clock pulse of output signal CLK_OUT may also be determined by the frequency of input signal CLK_IN. The frequency of the input signal may be equal to or a multiple of the frequency of the output signal. The frequency of the output signal here corresponds to the frequency of the input signal.

According to the circuit, charging time $t_2$ of capacitor $C_2$ is computed as follows:

$$t_2=C_2 \times U_{ref}/I_2. \quad (3)$$

This results in the pulse duty factor of output signal CLK_OUT as follows:

$$D=t_2/T=t_2/(2 \times t_1)=(C_2 * I_1)/(2 \times C_1 \times I_2). \quad (4)$$

Currents $I_1$ and $I_2$ and capacitors $C_1$ and $C_2$ may be freely selected. Pulse duty factor D may be set between 0% and 100%.

Figure 4:
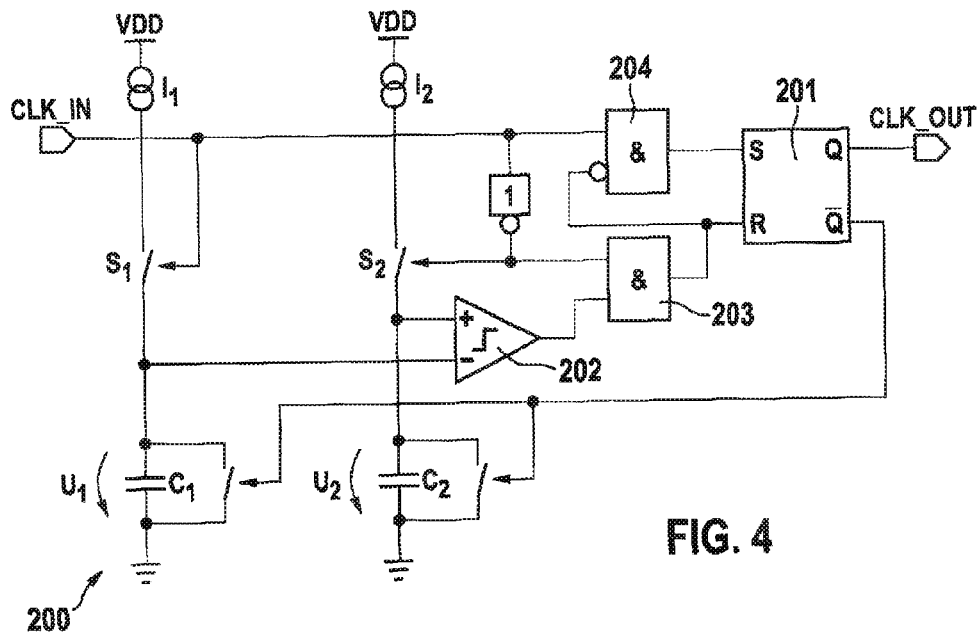
FIG. 4 shows a circuit diagram of a circuit for a fixed pulse duty factor between 50% and 100%.

FIG. 4 illustrates a simplified circuit 200 with which an arbitrary pulse duty factor between 50% and 100% may be set. In comparison to FIG. 1, the sample-and-hold circuit and the generation of the three nonoverlapping clock signals $S_1$, $S_2$, and $S_3$ are dispensed with. The associated signal patterns of circuit 200 are illustrated in FIG. 5.

Figure 5:
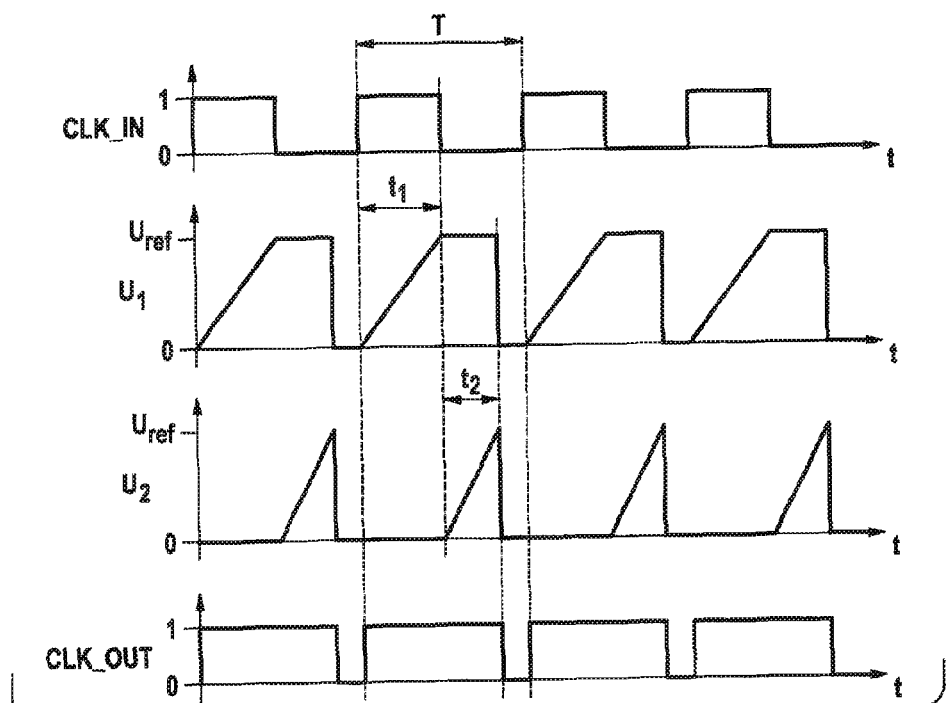
FIG. 5 shows a diagram with signal patterns of the circuit from FIG. 4.

Capacitor $C_1$ is charged by current source $I_1$ to voltage $U_{ref}$ while CLK_IN=1, as illustrated in voltage curve $U_1$ in FIG. 5. Voltage $U_{ref}$ is computed as follows:

$$U_{ref}=I_1/(t_1 \times C_1). \quad (5)$$

Charging time $t_1$ corresponds to one-half period T of input signal CLK_IN:

$$t_1=C_1 \times U_{ref}/I_1=T/2. \quad (6)$$

An SR flip-flop 201 is set with each rising flank of CLK_IN, which results in output signal CLK_OUT increasing to 1.

When input signal CLK_IN=0, second capacitor $C_2$ is charged via a switch $S_2$ until its voltage $U_2$ reaches value $U_{ref}$. The state of SR flip-flop 201 does not change during the charging operation of second capacitor $C_2$, so that a "1" is still present at signal CLK_OUT.

A comparator 202 compares the two voltages $U_1$ and $U_2$ to one another, and outputs an output signal when voltage $U_2$ across capacitor $C_2$ reaches value $U_{ref}$ of charged first capacitor $C_1$. An AND gate 203 links the output of comparator 202 to negated input signal CLK_IN, so that SR flip-flop 201 is now reset. With the resetting of SR flip-flop 201 which is triggered by comparator 202, the pulse of output signal CLK_OUT is terminated. The two capacitors $C_1$ and $C_2$ are discharged via the inverting output of SR flip-flop 201, which is now active, via switches. An AND gate 204 links input signal CLK_IN to the inverted signal of AND gate 203 in order to provide the output at the input of SR flip-flop 201.

Charging time $t_2$ of $C_2$ is computed as follows:

$$t_2 = C_2 \times U_{ref}/I_2. \quad (7)$$

This results in the pulse duty factor of CLK_OUT as follows:

$$D = (t_1+t_2)/T = \frac{1}{2} \times (1+t_2/t_1) = \frac{1}{2} \times [1+(C_2 \times I_1)/(C_1 \times I_2)]. \quad (8)$$

Currents $I_1$ and $I_2$ and capacitors $C_1$ and $C_2$ may be freely selected. The pulse duty factor may be set between 50% and 100%. The pulse duration of output signal CLK_OUT corresponds here to charging period $t_1$ of first capacitor $C_1$ plus charging period $t_2$ of second capacitor $C_2$. Or, expressed another way, the pulse of output signal CLK_OUT corresponds to the pulse of input signal CLK_IN plus charging period $t_2$ of second capacitor $C_2$. First capacitor $C_1$ here is charged during the pulse duration of input signal CLK_IN, while second capacitor $C_2$ is charged during the zero component of input signal CLK_IN. The two charging periods $t_1$ and $t_2$ are added to yield the pulse duty factor between 50% and 100%.

Figure 6:
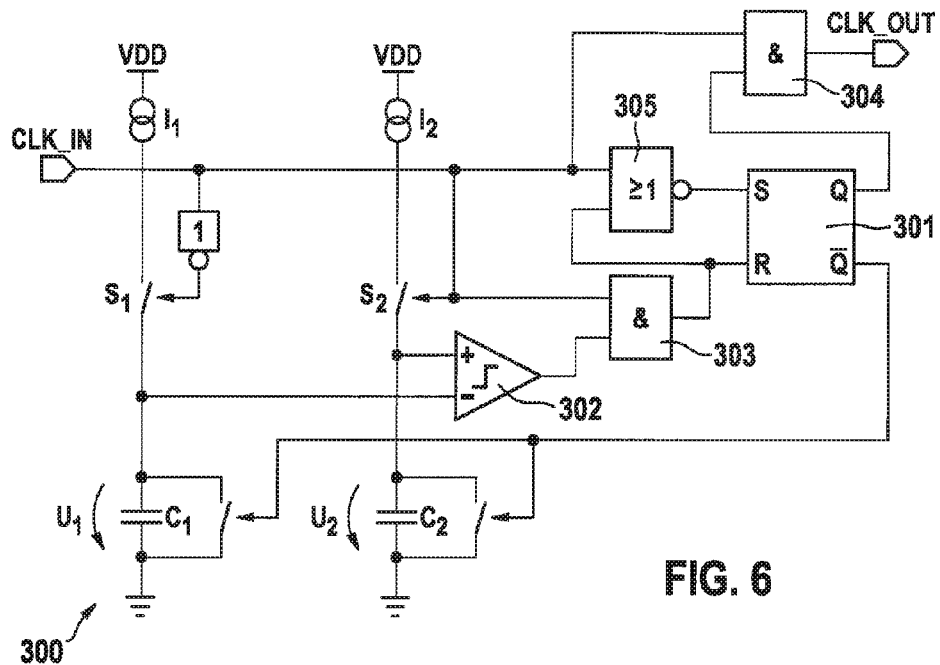
FIG. 6 shows a circuit diagram of a circuit for a fixed pulse duty factor between 0% and 50%.

FIG. 6 illustrates a circuit 300 for generating an arbitrary pulse duty factor between 0 and 50%. Circuit 300 is once again a simplified circuit from FIG. 1. Thus, here as well the sample-and-hold circuit and the generation of the three nonoverlapping clock signals $S_1$, $S_2$, and $S_3$ are dispensed with.

Figure 7:
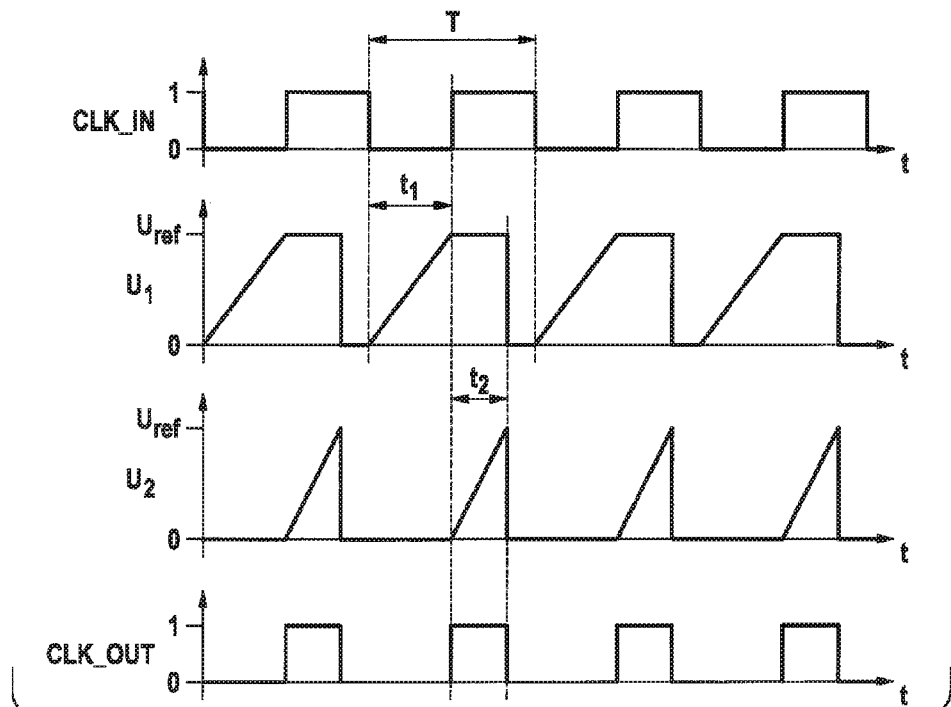
FIG. 7 shows a diagram with signal patterns of the circuit from FIG. 6.

Circuit 300 once again includes a first capacitor $C_1$ which is connected to a first current source $I_1$ via a first switch $S_1$. Similarly, a second capacitor $C_2$ is connected to a second current source $I_2$ via a second switch $S_2$. An SR flip-flop 301 is set with each falling flank of input signal CLK_IN. Capacitor $C_1$ is charged to voltage $U_{ref}$ by current source $I_1$ while CLK_IN=0, as illustrated in voltage curve $U_1$ in FIG. 7. Voltage $U_{ref}$ is computed as follows:

$$U_{ref} = I_1/(t_1 \times C_1). \quad (9)$$

Charging time $t_1$ corresponds to one-half period T of the basic clock pulse or of input signal CLK_IN:

$$t_1 = C_1 \times U_{ref}/I_1 = T/2. \quad (10)$$

Capacitor $C_2$ is charged by current source $I_2$ with the rising flank of CLK_IN. If a comparator 302, which compares the two voltages $U_1$ and $U_2$ to one another, detects that voltage $U_2$ across second capacitor $C_2$ is equal to charging voltage $U_{ref}$ of first capacitor $C_1$, an output signal of comparator 302 is set. An AND gate 303, whose inputs are connected to the output of comparator 302 and to input signal CLK_IN, now outputs an output signal and thus resets SR flip-flop 301, which sets the output of SR flip-flop 301 to 0 and sets the inverted output to 1. As a result, the two capacitors $C_1$ and $C_2$ are discharged via two switches. A NOR gate 305 links input signal CLK_IN to the output signal of AND gate 303 in order to provide the output at the input of SR flip-flop 301.

The inputs of an AND gate 304 are connected to input signal CLK_IN and to output Q of SR flip-flop 301. An output signal CLK_OUT is present at the output of AND gate 304. For output signal CLK_OUT, this means that as the flank of input signal CLK_IN rises, the flank of output signal CLK_OUT also rises, since SR flip-flop 301 has been set with the previously falling flank of input signal CLK_IN. AND gate 304 is blocked due to the resetting of SR flip-flop 301 which is initiated by comparator 302, so that the pulse of output signal CLK_OUT is terminated. The duration of the pulse of the output signal of CLK_OUT therefore corresponds to charging period $t_2$ of second capacitor $C_2$.

Charging time $t_2$ of second capacitor $C_2$ is computed as follows:

$$t_2 = C_2 \times U_{ref}/I_2. \quad (11)$$

Clock signal CLK_OUT results as follows:

$$D = t_2/T = t_2/(2 \times t_1) = (C_2 \times I_1)/(2 \times C_1 \times I_2). \quad (12)$$

Currents $I_1$ and $I_2$ and capacitors $C_1$ and $C_2$ may be freely selected. Pulse duty factor D may be set between 0% and 50%. First capacitor $C_1$ is charged here during the zero component of input signal CLK_IN, while second capacitor $C_2$ is charged during the pulse duration of input signal CLK_IN. Output signal CLK_OUT corresponds to input signal CLK_IN as long as second capacitor $C_2$ is charged. In other words, the pulse duty factor between 0% and 50% is determined by charging period $t_2$.

Figure 8:
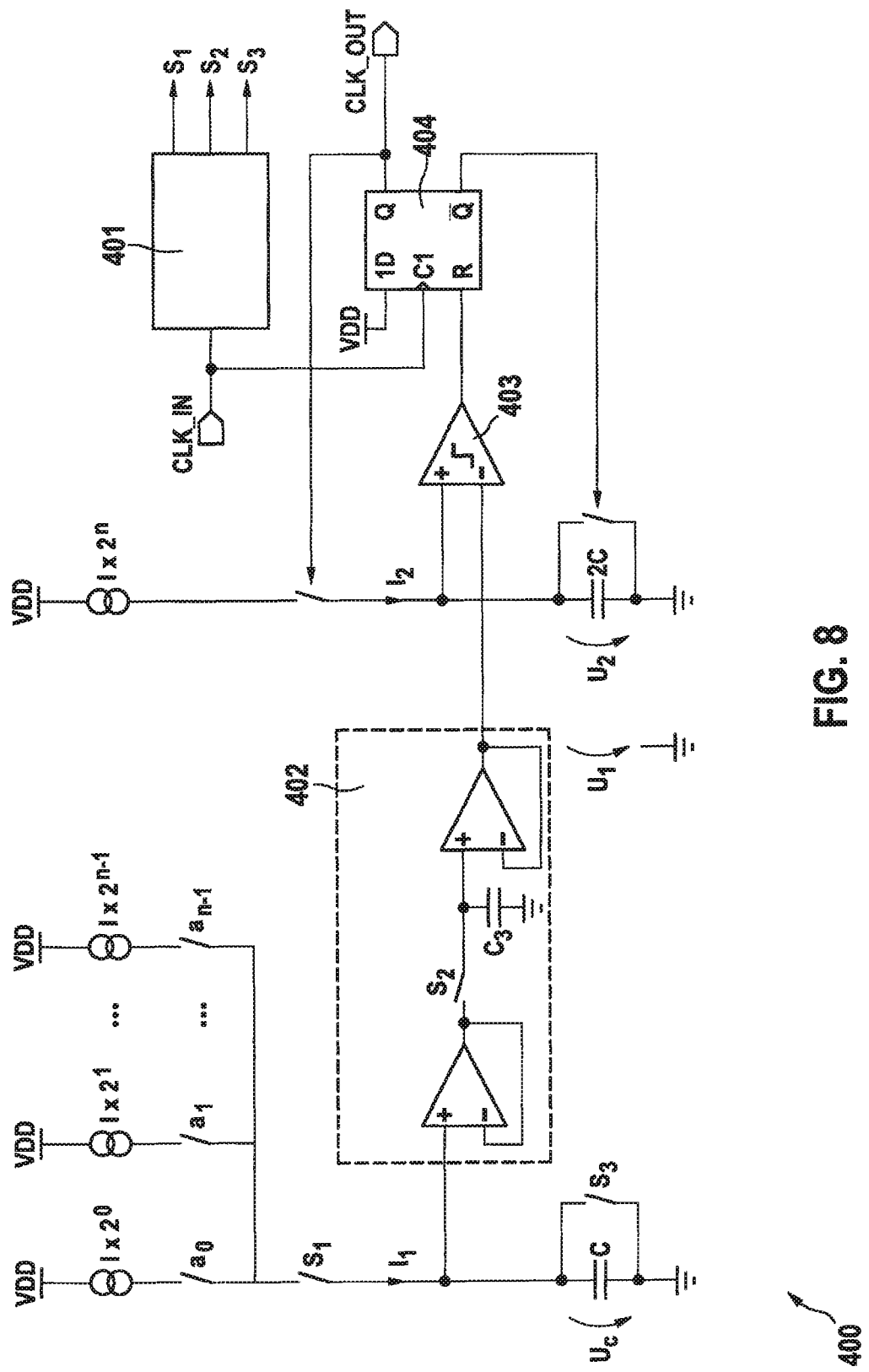
FIG. 8 shows a circuit diagram of a circuit for a variable pulse duty factor between 0% and 100%.

FIG. 8 illustrates another circuit 400 with which an output signal CLK_OUT having a variable or settable pulse duty factor between 0 and 100% may be generated. Circuit 400 is based essentially on circuit 100 from FIG. 1. Circuit 400, the same as circuit 100, includes a switch actuator 401, a sample-and-hold circuit 402, a comparator 403, and a D flip-flop 404. Capacitor $C_1$, having a capacitance of C, is connected to multiple current sources $I \times 2^0$ through $I \times 2^{n-1}$ via a switch $S_1$. Each of the current sources is connected via a switch $a_0$ through $a_{n-1}$, so that with a data word $[a_{n-1} \ldots a_0]$, current $I_1$ may be set via connectable current sources $I \times 2^0$ through $I \times 2^{n-1}$:

$$I_1 = (a_0 \times 2^0 + \ldots + a_{n-1} \times 2^{n-1}) \times I. \quad (13)$$

Current I is arbitrarily selectable. Current $I_2$ from current source $I \times 2^n$ is set to the value $$I_2 = 2^n \times I. \quad (14)$$

The second capacitor, across which voltage $U_2$ drops, is selected as $2 \times C_1$, i.e., 2C in this case. This may be represented as follows:

$$C_2 = 2 \times C_1 = 2 \times C. \quad (15)$$

This results in pulse duty factor D of CLK_OUT corresponding to formula (4) from FIG. 1:

$$D = (a_0 \times 2^0 + \ldots + a_{n-1} \times 2^{n-1})/2^n. \quad (16)$$

Pulse duty factors of $$D = [0; (2^n-1)/2^n] \quad (17)$$

may thus be set. The signal patterns illustrated for circuit 100 in FIG. 3 correspondingly apply for circuit 400. Likewise, the mode of operation of circuit 100 corresponds to that of circuit 400.

Alternatively, the two currents $I_1$ and $I_2$ may be normalized by dividing by a factor, preferably $(a_0 \times 2^0 + \ldots + a_{n-1} \times 2^{n-1})$. For current $I_1$, according to equation (13) this results in $I_1 = I$, and for current $I_2$, according to equation (14) this results in $I_2 = [2^n/a_0 \times 2^0 + \ldots + a_{n-1} \times 2^{n-1})] \times I$. Since $U_{ref}$ is determined by $U_1$, and $I_1$ is held constant here, $U_{ref}$ always has the same value at the same frequency of the input signal. Comparator 403 therefore always switches at the same threshold, regardless of the data word that is set. However, the rise speed of voltage $U_2$ across capacitor $C_2$ thus changes with the data word. The two implementations may be combined with one another. For example, the division may take place using only the higher-value terms.

Figure 9:
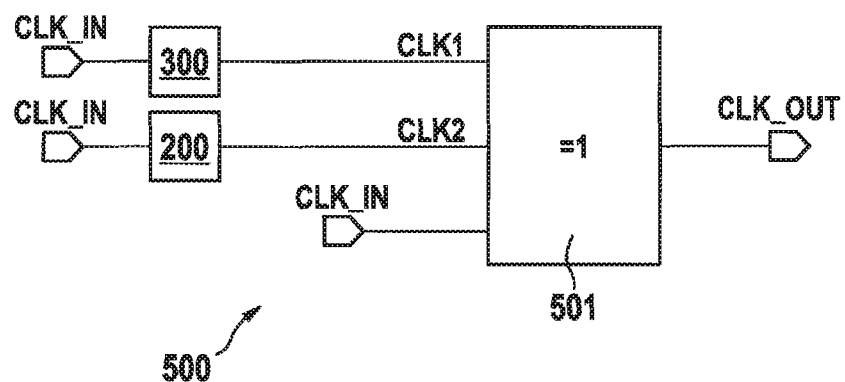
FIG. 9 shows a circuit diagram of a circuit for generating a signal with a doubled frequency.

FIG. 9 illustrates a circuit 500 with which a doubling in frequency of an input signal CLK_IN may be achieved.

For this purpose, circuit 300 illustrated in FIG. 6 generates from input signal CLK_IN an output signal or intermediate signal CLK1 having a pulse duty factor of 25%. Circuit 200 illustrated in FIG. 4 generates from input signal CLK_IN a signal CLK2, such as an output signal or intermediate signal, having a pulse duty factor of 75%.

The two output signals CLK1 and CLK2 of the two circuits 300 and 200, respectively, and input signal CLK_IN having a pulse duty factor of 50% are supplied to an XOR gate 501, at the output of which output signal CLK_OUT is then output with a doubled frequency compared to input signal CLK_IN or the two signals CLK1 and CLK2.

Accordingly, the output signal is computed as follows:

$$\text{CLK\_OUT} = \text{CLK\_IN xor CLK1 xor CLK2}. \qquad (18)$$

Figure 10:
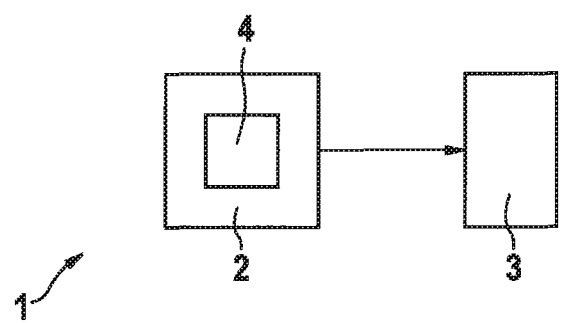
FIG. 10 shows a schematic illustration of a digital switching controller.

FIG. 10 shows a schematic illustration of a digital switching controller 1. Digital switching controller 1 includes a digital component 2 for generating a control signal having a pulse duty factor, and an output stage 3 which is controlled with this signal. Digital component 2 contains a circuit 4 which corresponds to one of circuits 100, 200, 300, 400, or 500. The control signal may then correspond to output signal CLK_OUT. Further components of the digital switching controller, such as the detection of the control voltage and possibly the input voltage, are not considered here for reasons of clarity.

The circuits described above may be used anywhere a clock pulse having a fixed or adjustable pulse duty factor is required, and where this output signal cannot or should not be generated from a faster basic clock pulse, using a digital circuit. Thus, for example, pulse width-modulated (PWM) signals may be used for controlling motors or lamps, preferably in the automotive field.

What is claimed is:

1. A circuit for generating an output signal from an input signal, wherein the input signal has a first pulse duty factor and the output signal has a second pulse duty factor, the circuit comprising:
a first capacitor and a second capacitor each connected to a charge source for periodically charging the first and second capacitors, wherein a voltage across the charged first capacitor is defined as a reference voltage, and wherein a pulse duty factor of the output signal is defined by a charging time of the second capacitor required to reach the reference voltage;
a comparator for comparing the reference voltage and a voltage of the second capacitor; and
a bistable trigger element having (i) inputs in communication with an output of the comparator and the input signal of the circuit, and (ii) an output via which the output signal of the circuit is provided,
wherein the circuit is part of a control system of a motor vehicle and is connected to a vehicle electrical system of the motor vehicle.

2. The circuit as recited in claim 1, wherein the input signal and the output signal have identical frequencies.

3. The circuit as recited in claim 2, wherein the pulse duration of the output signal is equal to the charging time of the second capacitor.

4. The circuit as recited in claim 3, further comprising:
a switch actuator for at least one of charging and discharging the first capacitor;
wherein the input signal of the circuit is connected to a clock pulse input of the bistable trigger element in such a way that the pulse duty factor of the output signal is between 0% and 100%.

5. The circuit as recited in claim 3, wherein: (i) a pulse component of the input signal is present at a signal input of the bistable trigger element, and (ii) the output signal of the comparator is present at a reset input of the bistable trigger element, in such a way that the pulse duty factor of the output signal is between 50% and 100%.

6. A method for generating by a circuit an output signal from an input signal, wherein the input signal has a first pulse duty factor and the output signal has a second pulse duty factor, the method comprising:
periodically charging a first capacitor of the circuit up to a reference voltage by a charge source;
periodically charging a second capacitor of the circuit by a further charge source;
forming a pulse duty factor of the output signal from a charging time of the second capacitor required to reach the reference voltage;
comparing, by a comparator, the reference voltage and a voltage of the second capacitor;
transmitting a result of the comparison as an output of the comparator to a bistable trigger element, wherein the bistable trigger element further receives the input signal of the circuit; and
outputting by the bistable trigger element the output signal of the circuit as a function of the received output of the comparator, wherein two preliminary output signals are generated in parallel, and the two preliminary output signals and the input signal are XOR-linked for generating the output signal of the circuit.

7. The method as recited in claim 6, wherein a pulse duration of the output signal is equal to the charging time of the second capacitor.

8. A digital switching controller, comprising:
a digital component for generating an output signal having a pulse duty factor; and
an output stage which is controlled with the output signal;
wherein the digital component includes a circuit for generating the output signal from an input signal, wherein the input signal has a first pulse duty factor and the output signal has a second pulse duty factor, the circuit including:
a first capacitor and a second capacitor each connected to a charge source for periodically charging the first and second capacitors, wherein a voltage across the charged first capacitor is defined as a reference voltage, and wherein a pulse duty factor of the output signal is defined by a charging time of the second capacitor required to reach the reference voltage;
a comparator for comparing the reference voltage and a voltage of the second capacitor; and
a bistable trigger element having (i) inputs in communication with an output of the comparator and the input signal of the circuit, and (ii) an output via which the output signal of the circuit is provided,
wherein the digital switching controller is part of a control system of a motor vehicle, and wherein at least the circuit of the digital component of the switching controller is connected to a vehicle electrical system of the motor vehicle.

9. A circuit for generating an output signal from an input signal, wherein the input signal has a first pulse duty factor and the output signal has a second pulse duty factor, the circuit comprising:
- a first capacitor and a second capacitor each connected to a charge source for periodically charging the first and second capacitors, wherein a voltage across the charged first capacitor is defined as a reference voltage, and wherein a pulse duty factor of the output signal is defined by a charging time of the second capacitor required to reach the reference voltage;
- a comparator for comparing the reference voltage and a voltage of the second capacitor; and
- a bistable trigger element having (i) inputs in communication with an output of the comparator and the input signal of the circuit, and (ii) an output, wherein the input signal and the output of the bistable trigger element are connected to inputs of an AND gate, and the output signal is provided at an output of the AND gate in such a way that the pulse duty factor of the output signal is between 0% and 50%.

\* \* \* \* \*